US 6,542,664 B2

(12) United States Patent
Srinivasan et al.

(10) Patent No.: US 6,542,664 B2
(45) Date of Patent: Apr. 1, 2003

(54) METHOD FOR EFFICIENT COUPLING OF LASER BEAMS INTO WAVEGUIDES

(75) Inventors: Balaji Srinivasan, Albuquerque, NY (US); Ravinder K. Jain, Albuquerque, NM (US); Jason David Tafoya, Albuquerque, NM (US)

(73) Assignee: Science & Technology Corporation @ UNM, Albuquerque, NM (US)

( * ) Notice: Subject to any disclaimer, the term of this patent is extended or adjusted under 35 U.S.C. 154(b) by 0 days.

(21) Appl. No.: 09/982,045

(22) Filed: Oct. 19, 2001

(65) Prior Publication Data

US 2002/0057874 A1 May 16, 2002

Related U.S. Application Data

(62) Division of application No. 09/576,797, filed on May 23, 2000.
(60) Provisional application No. 60/135,553, filed on May 24, 1999.

(51) Int. Cl.[7] .................................................. G02B 6/32
(52) U.S. Cl. ............................. 385/33; 385/25; 385/34
(58) Field of Search ............................. 385/25, 33, 34, 385/35

(56) References Cited

U.S. PATENT DOCUMENTS

| | | | |
|---|---|---|---|
| 5,084,880 A | 1/1992 | Esterowitz et al. | 372/6 |
| 5,218,608 A | 6/1993 | Aoki | 372/6 |
| 5,349,590 A | 9/1994 | Amirkhanian et al. | 372/6 |
| 5,423,798 A | 6/1995 | Crow | 606/4 |
| 5,623,362 A | 4/1997 | Mitsuda et al. | 359/341 |
| 5,642,370 A | 6/1997 | Mitchell et al. | 372/25 |
| 5,668,821 A | 9/1997 | Hodgson et al. | 372/6 |
| 5,677,920 A * | 10/1997 | Waarts et al. | 372/6 |
| 5,790,722 A | 8/1998 | Minden et al. | 385/27 |
| 5,883,748 A * | 3/1999 | Shum | 359/819 |

* cited by examiner

Primary Examiner—Cassandra Spyrou
Assistant Examiner—Alessandro V. Amari
(74) Attorney, Agent, or Firm—Jagtiani + Guttag

(57) ABSTRACT

An improved highly doped waveguide is provided which comprises a waveguide employing an Er dopant and Pr sensitizer ions. The present invention also provides a method of efficient coupling from an optical source into a waveguide using a rotated optical element.

15 Claims, 10 Drawing Sheets

METHOD FOR EFFICIENT COUPLING OF LASER BEAMS INTO WAVEGUIDES

CROSS-REFERENCE TO RELATED APPLICATIONS

This application is a division of application Ser. No. 09/576,797 filed May 23, 2000. This application refers to the following co-pending U.S. patent applications. The first application is U.S. Prov. App. No. 60/135,553, entitled "Method for Efficient Coupling of Laser Beams into Waveguides," filed May 24, 1999. The second application is U.S. patent application Ser. No. 09/302,839, entitled "Highly Doped Fiber Lasers and Amplifiers" filed Apr. 30, 1999. The entire contents and disclosures of both of these applications are hereby incorporated by reference.

This invention is made with government support under grant number F49620-96-1-0079, awarded by the Air Force Office of Scientific Research. The government may have certain rights in this invention.

BACKGROUND OF THE INVENTION

1. Field of the Invention

The present invention relates generally to efficient coupling of laser beams into multimode waveguides and specifically to waveguide lasers and amplifiers based on low phonon energy glasses or crystals doped with external or impurity atoms or ions, and more particularly to devices using waveguides based on such glasses that incorporate high concentration of atoms or ions.

2. Description of the Prior Art

Because of the strong water absorption near 3 $\mu$m in tissue and the consequent ultrashort penetration depths (of a few microns), compact high power (100 mW to 1 W) 2.7 $\mu$m laser sources with TEM$_{00}$ beam quality have several important applications in ultrafine intraocular and endoscopic laser surgery including transmyocardial revascularization and other intra-arterial procedures. Compact and efficient sources of mid-IR radiation are also needed for infrared countermeasures applications, and for ppb (parts per billion) level spectroscopic monitoring of several important species such as carbon monoxide (CO), formaldehyde ($H_2CO$), nitric oxide (NO), nitrogen dioxide ($NO_2$), hydrogen sulfide ($H_2S$), arsine ($AsH_3$), and phosphine ($PH_3$).

The 2.7 $\mu$m transition in Er:ZBLAN is well-suited for several of the above applications. For instance, the broad tunability of this transition (2.65–2.83 $\mu$m) should enable ppb spectra monitoring of $H_2S$ (2.65 $\mu$m) and NO (2.7 $\mu$m). However, as has been frequently stated, the longer natural lifetime of the lower laser level ($^4I_{13/2}$, 9.4 ms) relative to that of the upper laser level ($^4I_{11/2}$, 7.5 ms) of the 2.7 $\mu$m transition often results in a population bottleneck that inhibits efficient steady-state (CW) lasing in Er:ZBLAN fiber lasers. As such this transition has been frequently called "self-terminating".

Efficient coupling of radiation from diode arrays into multimode waveguides and in particular, to the inner cladding, multimode waveguide, of a double clad fiber is a key issue in the realization of high power diode-pumped fiber lasers. Specifically, it is often necessary to correct for any astigmatism in the diode beam in order to couple into the inner cladding efficiently. In addition, the beam shape of the diode radiation has to match the shape of the inner cladding, e.g. circular, rectangular, etc. Currently, such astigmatism correction and beam shaping are typically performed by a prism pair or by the use of two or more lenses. Beam shaping has also been performed using either an aperture or parallel stacked plates or a multimode fiber.

SUMMARY OF THE INVENTION

It is therefore an object of the present invention to provide an improved highly doped fiber laser and/or amplifier that will provide high efficiency and high power output.

It is a further object to provide a highly doped fiber laser and/or amplifier which greatly reduces or eliminates the bottleneck associated with the longer lifetime of the lower laser level $^4I_{13/2}$ if Er is used as a dopant.

It is yet another object to provide a fiber laser and/or amplifier that has a dopant at a concentration level that results in clusters of such dopants.

It is yet another object to provide highly doped fiber laser and/or amplifier having a dopant that greatly enhances cross-relaxation.

It is yet another object to provide highly doped fiber laser and/or amplifier having a dopant that greatly enhances cross-relaxation by creating ion or dopant clusters.

It is yet another object to provide sensitizer ions or atoms to assist in the depopulation of lower energy levels through the energy transfer process.

In all of the above embodiments, it is an object to provide a highly doped fiber laser and/or amplifier that has a dopant concentrations between 1,001 and 149,999 ppm.

It is an object of the present invention to provide a method for efficient coupling of light from an optical source or an array into a multimode waveguide.

It is yet another object of the present invention to provide a method for astigmatism correction in a laser that may be performed by a single optical element.

It is yet another object of the present invention to provide a method for beamshaping of a laser with a single optical element.

According to a first broad aspect of the present invention, there is provided a highly doped waveguide comprising: a waveguide; a dopant consisting of Er disposed in the waveguide; and sensitizer ions consisting of Pr disposed in the waveguide, wherein the dopant has a concentration of between 1,000 to 150,000, wherein the sensitizer ions have a concentration of between 100 and 20,000 ppm, and wherein the concentration of the dopant enhances cross-relaxation between two elements of the dopant.

According to a second broad aspect of the present invention there is provided a highly doped optical material comprising: a low phonon energy bulk material; a dopant consisting of Er disposed in the bulk material; and sensitizer ions consisting of Pr disposed in the bulk material, wherein the dopant has a concentration of between 1000 and 150,000 ppm, the sensitizer ions have a concentration between about 100 and about 20,000 ppm, wherein the waveguide contains clusters of the dopant, and wherein the clusters enhance cross-relaxation between two elements of the dopant.

According to a third broad aspect of the present invention there is provided a highly doped bulk material laser comprising: a low phonon energy bulk material; a dopant consisting of Er disposed in the bulk material; sensitizer ions consisting of Pr disposed in the bulk material; a resonant cavity, the resonant cavity being defined by a first and second reflective means at an amplification wavelength and disposed at two ends of the bulk material; and an energy source for injecting energy into the bulk material, wherein the dopant has a concentration of between 1,000 and 150,000 ppm, the sensitizer ions have a concentration between about 100 and about 20,000 ppm, and wherein the dopant enhances cross-relaxation between two elements of the dopant.

According to a fourth broad aspect of the present invention there is provided a highly doped bulk material amplifier comprising: a low phonon energy bulk material; a dopant consisting of Er disposed in the bulk material; sensitizer ions consisting of Pr disposed in the bulk material; and an energy source for injecting energy into the bulk material, wherein the dopant has a concentration of between 1,000 and 150,000 ppm, the senitizer ions have a concentration between about 100 and about 20,000 ppm, and wherein the dopant enhances cross-relaxation between two elements of the dopant.

According to a fifth broad aspect of the present invention there is provided a device for coupling an optical source to a multimode waveguide, the device comprising: an optical source, the optical source having an optical plane associated therewith; a waveguide; and a coupling means comprising an optical element, the optical element having a light receiving surface, a lens axis and an optical element axis, the optical element being rotated around the optical element axis to create an angle of rotation between the lens axis and the optical plane.

According to a sixth broad aspect of the present invention there is provided a device for coupling an optical source to a waveguide, the device comprising: an optical source, the optical source having an optical plane associated therewith; a waveguide; and an astigmatism correction and beam shaping means, the means comprising a single optical element, the optical element having a light receiving surface, a lens axis and an optical element axis, the optical element being rotated around the optical element axis to create an angle of rotation between the lens axis and the optical plane.

According to a seventh broad aspect of the present invention there is provided a high power diode-pumped fiber laser, the fiber laser comprising: an array of diode lasers, the array of diode lasers having an optical plane associated therewith; a waveguide; and an astigmatism correction and beam shaping means, the means comprising a single optical element, the optical element having a light receiving surface, a lens axis and an optical element axis, the optical element being rotated around the optical element axis to create an angle of rotation between the lens axis and the optical plane.

According to an eighth broad aspect of the present invention there is provided a device for coupling an optical source to a waveguide, the device comprising: a waveguide; a dopant consisting of Er disposed in the waveguide; sensitizer ions consisting of Pr disposed in the waveguide, wherein the dopant has a concentration of between 1,000 to 150,000, wherein the sensitizer ions have a concentration of between 100 and 20,000 ppm, and wherein the concentration of the dopant enhances cross-relaxation between two elements of the dopant; an optical source, the optical source having an optical plane associated therewith; and a coupling means comprising an optical element, the optical element having a light receiving surface, a lens axis and an optical element axis, the optical element being rotated around the optical element axis to create an angle of rotation between the lens axis and the optical plane.

Other objects and features of the present invention will be apparent from the following detailed description of the preferred embodiment.

BRIEF DESCRIPTION OF THE DRAWINGS

The invention will be described in conjunction with the accompanying drawings, in which.

DETAILED DESCRIPTION OF THE PREFERRED EMBODIMENT

Definitions

Figure 1:
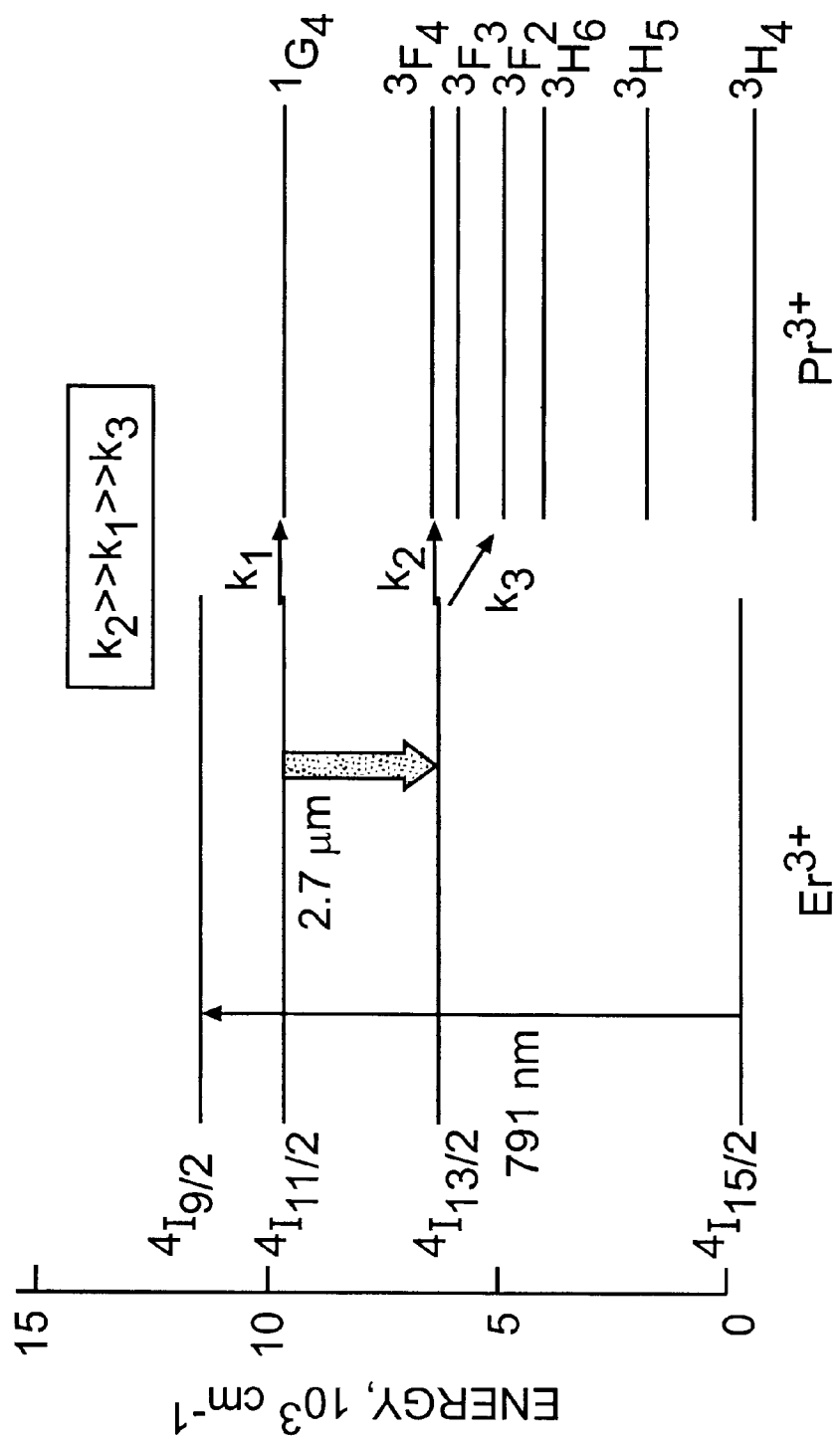
FIG. 1 is an energy diagram illustrating the dominant energy transfer pathways between laser levels in Er and resonantly-matched energy levels in Pr ($k_1=0.15\times10^3 s^{-1}$ for a 20,000/5,000 ppm Er/Pr:ZBLAN fiber.

Before a substantive discussion of the preferred embodiment may begin, it is essential to define several key terms.

The term "waveguide" is used in this application to mean any low phonon energy material used to channel an optical signal, at any frequency. Specific examples of waveguides include, but are not limited to: fiber-optic waveguides; planar glass; crystalline and semiconductor waveguides. Examples of preferred materials for semiconductor waveguides include, but are not limited to: GaN, GaAs, ZnS, and ZnSc. It should be appreciated that semiconductor waveguides may be driven by electrical means which is considered an equivalent to the optical sources discussed below.

The term "bulk material" is used in this application to mean any low phonon energy material that may have an electrical or optical signal inserted therein. Specific examples of bulk materials include, but are not limited to: bulk glasses such as chalcogenides, tellurides, fluorides, silicates, and chelates; as well as crystals such as YLF, PaYF, $BAY_2F_8$; as well as semiconductors such as, but not limited to GaN, ZnS, ZnSe, GaAs, and AlAs.

The term "fiber optic cable" or "fiber optic waveguide" is used in this application to mean any waveguide utilized to guide light waves from one point to another. This definition specifically includes both single mode and multi-mode fibers as well as any waveguide having any cross-sectional shape or any single or multi-clad geometry. In addition, this term also includes any waveguide whether doped or undoped.

The term "Bragg grating" is used in this application to mean a structure containing alternating periodic segments of varying periods of high and low refractive index material segments and/or appropriately embedded phase shift segments at well defined locations of the structure. A period is defined as one set of adjacent high and low refractive material segments. It is understood by this definition that the order of the high and low index materials is irrelevant, only that there is a change in refractive index between adjacent segments. While only uniform gratings are illustrated, non-uniform gratings are also contemplated within the scope of the invention.

The term "dopant" is used in the present invention to mean any extraneous element or combination thereof which is added to a material to enhance or suppress a characteristic of that material. Examples of dopants include, but are not limited to: germanium (Ge), hydrogen (H), holmium (Ho), sodium (Na), lithium (Li), lead (Pb), zirconium (Zr), zinc (Zn), erbium (Er), praseodymium (Pr), thulium (Tm), potassium (K), calcium, and other atomic or ionic species. The particular characteristics of interest in the present invention are the ability to act as an active or light amplifying material and to conduct cross relaxation between ions of the dopant, or energy transfer between the dopant and sensitizer ions. A preferred dopant for the present invention is Er.

The term "sensitizer ions" is used in the present invention to mean any extraneous element or combination thereof which is added to a material to enhance or suppress a characteristic of the dopant. Typical examples of sensitizer ions include, but are not limited to: ytterbium (Yb), praseodymium (Pr), thulium (Tm), terbium (Tb), europium (Eu), and erbium (Er), and other atoms or ions. The particular characteristics of interest in the present invention are the ability to enhance energy transfer between the dopant and the sensitizer ion. This in turn has the benefit of greatly increasing efficiency of the device as described below. The preferred sensitizer ions for the present invention are Pr ions.

The term "cluster" or "ion cluster" is used in the present application to mean a grouping of dopants and/or sensitizer atoms or ions having a concentration that exceeds the average concentration of dopants and/or sensitizer atoms or ions in the material.

The term "resonant cavity" is used in the present invention to mean any means for reflecting light in the waveguide. Specific examples include, but are not limited to: external mirrors on one or both ends of the waveguide, reflective coatings on the end surfaces of the waveguide, gratings formed within or spliced to the waveguide, Fresnel reflections at the fiber ends, or any combination of the above.

The term "optical source" is used in the present invention to mean any individual or group of means of inputting or generating a light wave in the waveguide. Specific examples include, but are not limited to: a single light emitting diode, a plurality of light emitting diodes, a single laser diode, an array of laser diodes, vertical cavity surface emitting lasers, laser bars, MFA-MOPAs, flared-resonator-type laser diodes, diode arrays, and other single-mode and multi-mode light sources. The particular characteristics of interest in the present invention are ability to provide high output power. It should be appreciated that electrical and electron beam sources may also be used in conjunction with the teachings of this invention. The term "energy source" includes both optical sources, electrical, and electron beam sources.

The term "array" refers to a square or rectangular or near-rectangular array of otpical sources such as an array of laser diodes.

The term "optical plane" refers to the plane parallel to one of the edges of the square or rectangular emission from an optical source including from a rectangular array and preferably the longer edge of the rectangle and the direction of the light propagation.

The term "light receiving surface" refers to the flat portion of cylindrical lens on which light from an optical source impinges.

The term "optical element" includes but is not limited to cylindrical lenses, barrel lenses, anamorphic and rod lenses.

The term "optical element axis" refers to the axis in the center the optical element about which the optical element is rotated in the device of the present invention.

The term "lens axis" refers to one of the principal axes of symmetry of the curved surfaces of the lens.

The term "angle of rotation" refers to the angle between the lens axis of a rotated optical element and the optical plane of the light source array.

Description

Enhanced efficiencies and output powers of steady-state (CW) lasing in Er:ZBLAN fiber lasers have been achieved by a simple technique, namely the use of fibers with high concentrations (>10,000 ppm) of Er. It was hypothesized that such high concentrations not only reduce the problem of ground state bleaching, but also cause significantly enhance cross-relaxation via the formation of Er ion clusters, whose net effect is to relax the excitation from the lower laser level ($^4I_{13/2}$) to the ground state ($^4I_{15/2}$) while upconverting an adjacent ion to the $^4I_{9/2}$ state. A fringe benefit of the use of high Er doping densities is the natural amenability of the consequent high core absorption to optimized designs of double-clad fibers capable of being pumped by relatively inexpensive high power diode arrays.

Using the device of the present invention, further improvements are now provided in power and efficiency of CW lasing at the 2.7 μm transition in $Er^{3+}$:ZBLAN fiber lasers by utilizing a complementary technique for enhancing the rate of depletion of the $^4I_{13/2}$ level of Er by energy transfer to the $^3F_3$ and the $^3F_4$ levels for Pr, as shown in FIG. 1. In particular, the present invention provides 660 mW of CW output from a 791 nm diode array-pumped Er/Pr:ZBLAN rectangular-clad fiber with a slope efficiency of 13% with respect to the absorbed pump power. The output power of the present invention is nearly an order of magnitude higher than the highest powers previously reported for a diode-pumped mid-IR fiber laser, and shows evidence of easy scalability to Watt power levels by very simple improvements such as optimization of the Er-Pr concentrations, increase of the pump power and coupling efficiencies, and the use of optimized output coupling.

A preferred fiber for use in the device of the present invention is a custom-designed rectangular-clad Er/Pr:ZBLAN fiber. The preferred rare-earth concentrations in the core of the fiber are based on the achieving efficient absorption in Er and rapid depopulation of the lower level, via enhanced cross-relaxation in Er and efficient transfer to Pr. The core of the fiber preferably has a diameter of 1 μm to 150 μm One preferred core diameter is 13 μm. The concentration ratio of Er to Pr is preferably about 1,000 to 150,000 ppm Er, more preferably 30,000 to 100,000 ppm Er, to 100 to 20,000 ppm Pr, more preferably 1,000 to 3,000 ppm Pr. One preferred Er/Pr ratio is about 20,000 ppm Er to 2,000 ppm Pr.

The present invention provides a high power, 660 mW, CW operation of a diode-pumped mid-IR Er fiber laser. The present invention accomplishes this operation by using efficient depopulation of the lower laser level via enhanced cross-relaxation between Er ions and energy transfer to Pr ions, at doping densities much higher than those used previously in Er:ZBLAN, along with optimal pumping of such lasers via custom-designed double-clad fluoride fibers. With optimized coupling optics, higher pump powers, and improved fiber design, >1 Watt power levels at 2.7 μm may be possible.

In one embodiment, the present invention provide a device that includes efficient coupling of laser beams from diode arrays into multimode waveguides of arbitrary shape. The present invention is able to provide both astigmatism correction and beam shaping using single optical element that is rotated at angle with respect to the optical plane of the light source. The angle of rotation for an optical element of the present invention may be between about 0.1 and 89.9°. A preferred optical element of the present invention is a cylindrical lens.

Figure 6A:
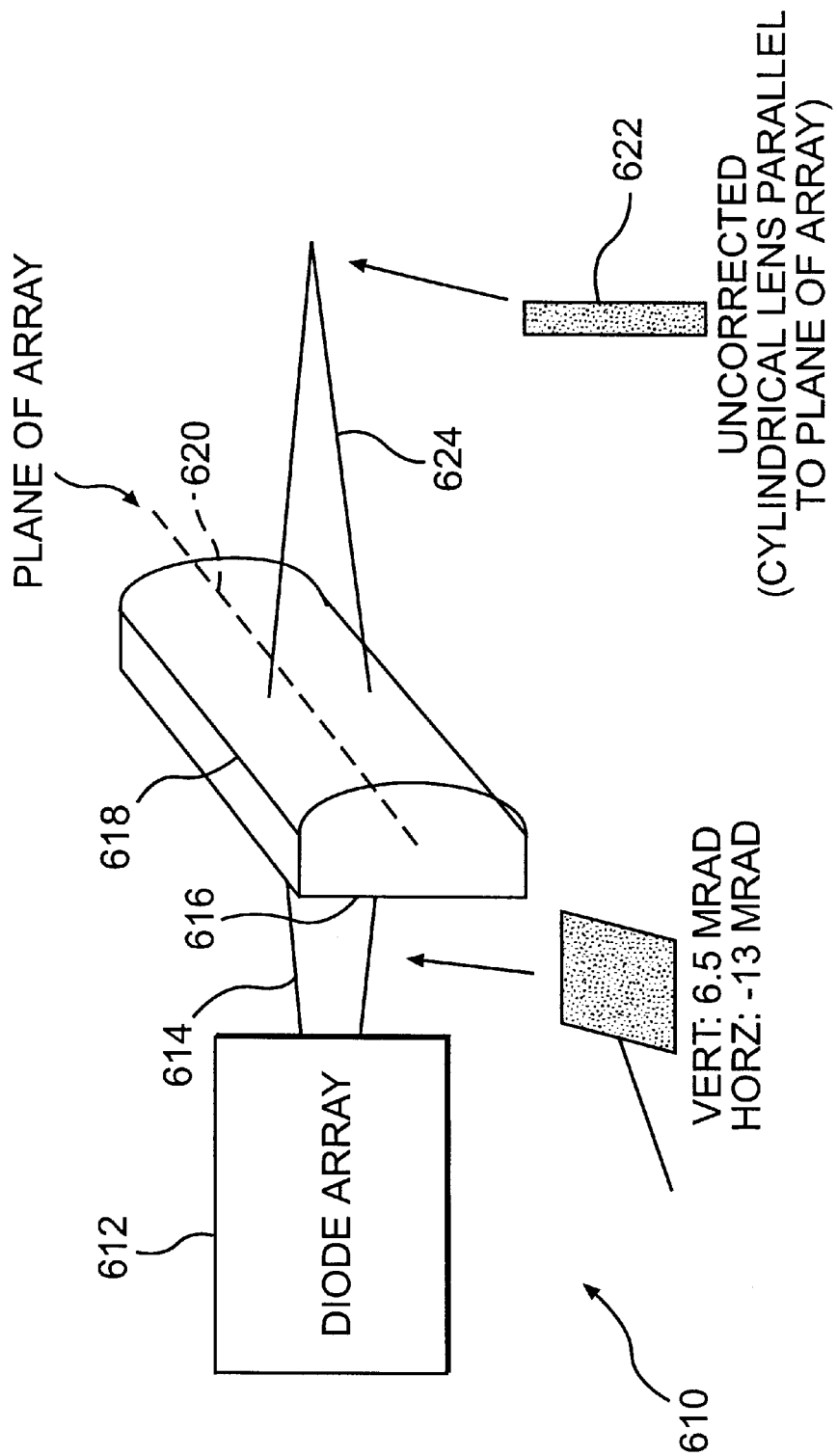
FIG. 6A is an illustration in schematic form of a prior art laser in which astigmatism remains uncorrected.
Figure 6B:
FIG. 6B is an a picture of a beam shape using the laser of FIG. 6A.

FIG. 6A illustrates a prior art laser diode array system 610 in which diode array 612 emits an emitted light beam 614 that impinges on a light receiving surface 616 of a cylindrical lens 618. Optical lens axis 620 is not rotated with respect to the optical plane. Output light beam 624 is emitted having an uncorrected elongated shape 626 that does not match the shape of the inner cladding of a fiber (not shown) on which output light beam 624 is focused. FIG. 6B is a picture of an uncorrected output light beam using the laser diode array system of FIG. 6A. The beam dimension of FIG. 6B is approximately 5,000 $\mu$m by 2,000 $\mu$m.

Figure 7A:
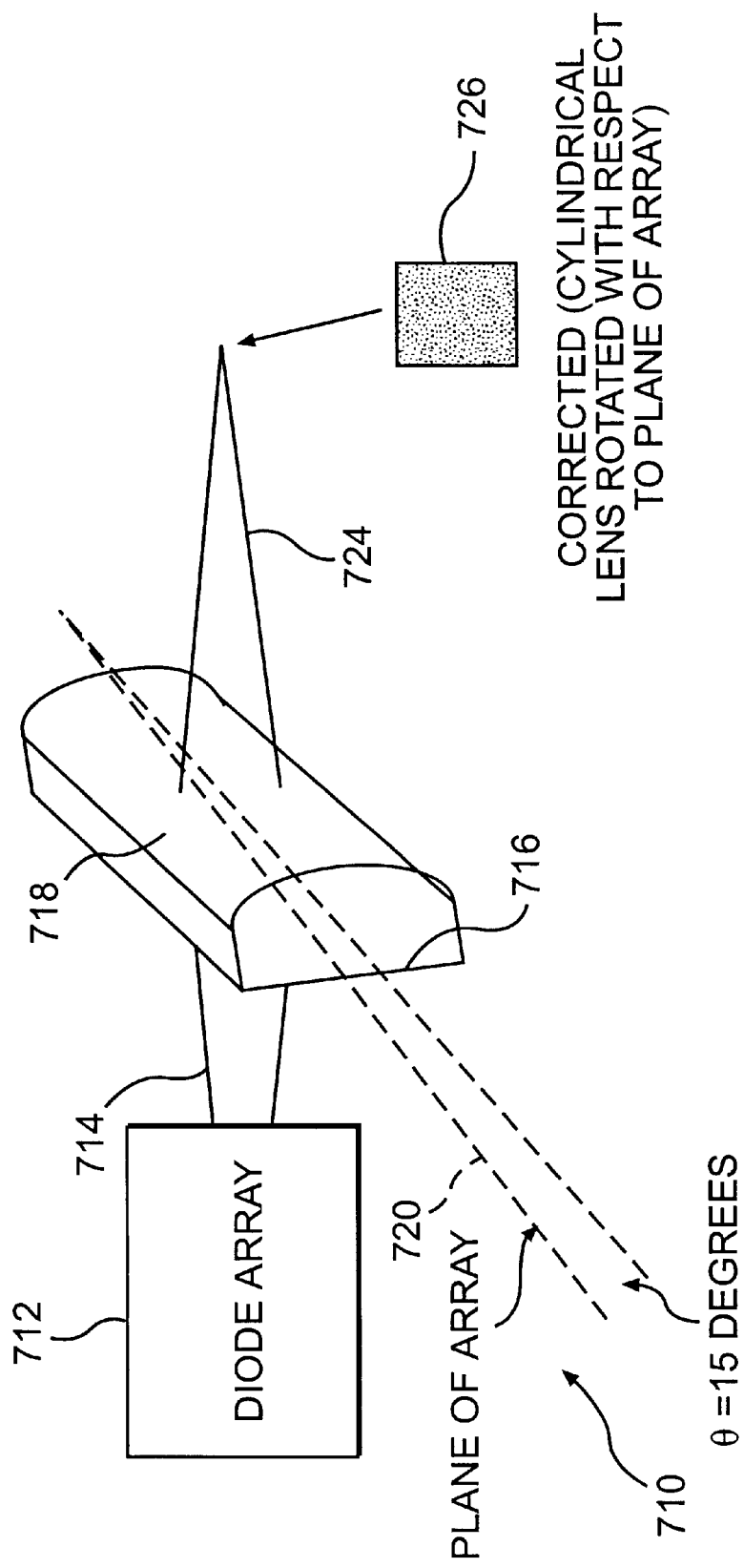
FIG. 7A is an illustration in schematic form of a laser of the present invention.
Figure 7B:
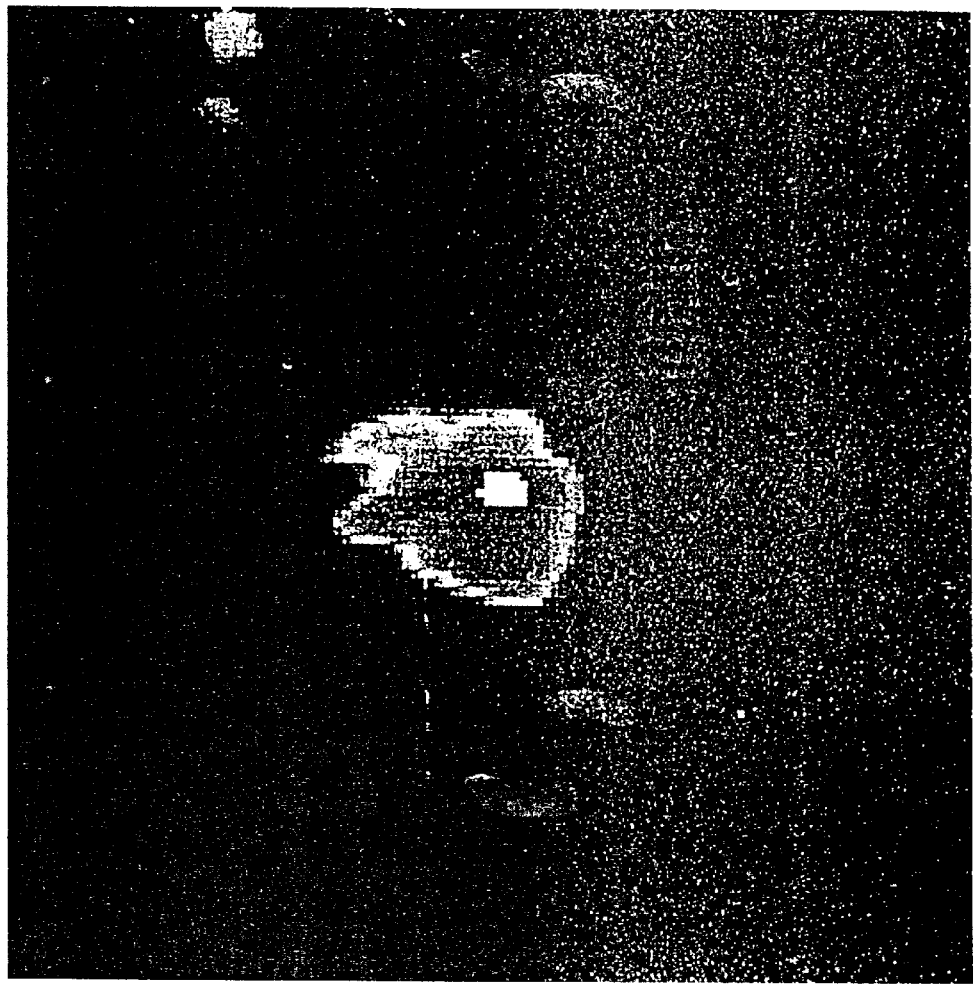
FIG. 7B is an is a picture of a beam shape using the laser of FIG. 7A.

FIG. 7A illustrates a laser diode array system 710 of the present invention in which diode array 712 emits a emitted light beam 714 that impinges on a light receiving surface 716 of a rotated cylindrical lens 718. Light receiving surface 716 is rotated which respect to an optical plane 720 of diode array 712 at an angle of rotation of 15°. Emitted light beam 714 is astigmatic, similar to the emitted light beam of FIG. 6A. However, because rotated cylindrical lens 718 provide astigmatism correction, output light beam 724 is emitted having a corrected shape 726 that matches the shape of the inner cladding of a fiber (not shown) on which output light beam 724 is focused. FIG. 7B is a picture of a corrected output light beam using the laser diode array system of FIG. 7A. The entire picture of FIG. 7B is approximately 5,000 $\mu$m by 2,000 $\mu$m.

Although only one type of plurality of optical sources, a laser diode array, is shown in FIG. 7A, the present invention may be used with other types of optical sources such as arrays of light emitting diodes, vertical cavity surface emitting lasers, laser bars, MFA-MOPAs, flared-resonator-type laser diodes, and other single-mode and multi-mode light sources.

Although FIG. 7A only shows the use of a cylindrical lens as an optical element of the present invention, other types of optical elements may also be used in the device of the present invention such as barrel lens, anamorphic lens and rod lenses.

The present invention will now be described by way of example.

EXAMPLE 1

A device of the present invention was tested employing a custom-designed rectangular-clad Er/Pr:ZBLAN fiber. The rare-earth concentrations in the core (dia.=13 $\mu$m, NA=0.16) were chosen to be 20,000 ppm of Er and 5,00 ppm of Pr, based on the requirement of efficient absorption of Er and rapid depopulation of the lower laser level, via enhanced cross-relaxiation in Er and efficient energy transfer to Pr. The lifetimes for the $^4I_{11/2}$ and the $^4I_{13/2}$ upper and lower laser levels were measured to be 2.5 ms and 0.7 ms respectively, corresponding to a lifetime ratio $\kappa$ of 3.57, for this specific co-doped system versus lifetimes of 4 ms and 2 ms respectively, $\kappa$=2.0, for singly-doped 20,000 ppm Er:ZBLAN fibe, and 7.5 ms and 9.4 ms respectively, $\kappa$=0.8, for traditional $\leq$1,000 ppm low concentration self-terminating 2.8 $\mu$m Er:ZBLAN laser.

Figure 2:
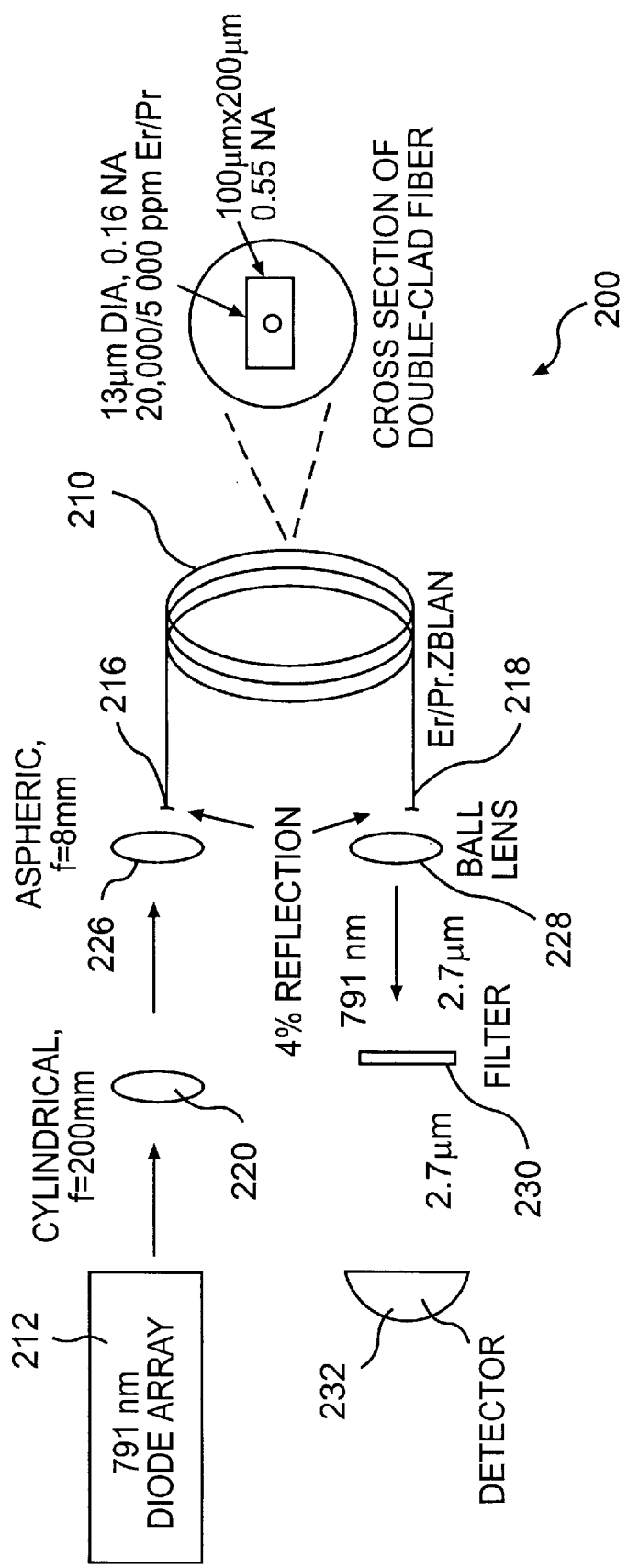
FIG. 2 is a schematic diagram of a diode pumped double-clad fiber laser of the present invention.
Figure 3:
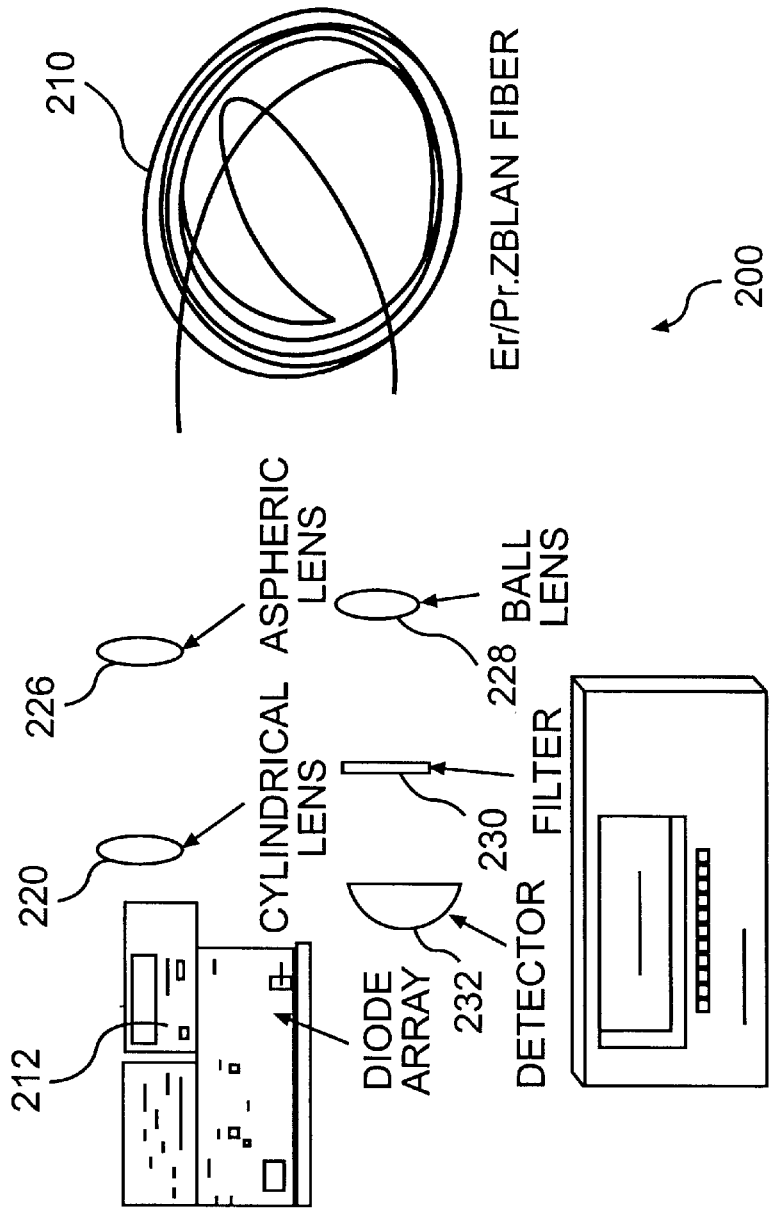
FIG. 3 is a photograph of the exmperimental setup shown schematically in FIG. 2.

FIG. 2 is a schematic diagram of a diode-pump laser setup 200 of the present invention used in the testing described above. FIG. 3 shows a photograph of the diode-pump laser setup 200. A double-clad Er:Pr ZBLAN waveguide 210 that was used was approximately 14 m long, with an Er concentration of 20,000 ppm and a Pr concentration of 5,000 ppm in a single mode 13 $\mu$m, 0.16 NA rectangular core. The inner cladding dimensions and NA of the undoped cladding of the double-clad fiber was chosen to be 100 $\mu$m×200 $\mu$m and 0.55 respectively to facilitate high coupling efficiencies for the diode beam. The pump source 212 was an Optopower 791 nm diode array capable of yielding nearly 10 Watts of CW power in a 8 mm×8 mm beam of 6.5 mrad divergence in the vertical plane and −13 mrad divergence in the horizontal plane. No dielectric mirrors were used for the laser cavity, and feedback was obtained simply by the ~4% Fresnel reflections at the two uncoated fiber ends 216,218. In order to match the diode array beam shape to the rectangular clad fiber, a cylindrical lens 220 having a 20 cm focal length was used and cylindrical lens 220 was rotated on its axis with respect to the optical plane of diode array 212 to compensate simultaneously for beam-shaping and astigmatism effects and thereby optimize coupling. Light passing through cylindrical lens 220 as then focused into the inner cladding of the double-clad Er:Pr ZBLAN waveguide 210 by an aspheric lens 226 of 8 mm focal length.

The net coupling efficiency and he effective pump (791 nm) absorption coefficient were measure to be 65% and 0.6 dB/m respectively. Given the measured value of the effective pump absorption coefficient and the estimated value of the background losses (0.1 dB/m) at the lasing transition, it was decided to sue a fiber length of 14 m. The value of the measured pump absorption for the fiber was ~85%.

Post processing is provided by a ball lens 228, which is preferably a sapphire ball lens, and a filter 230 that passes the desired output frequency, 2.7 $\mu$m. Finally, a detector 232 was provided for measuring purposes.

Figure 4:
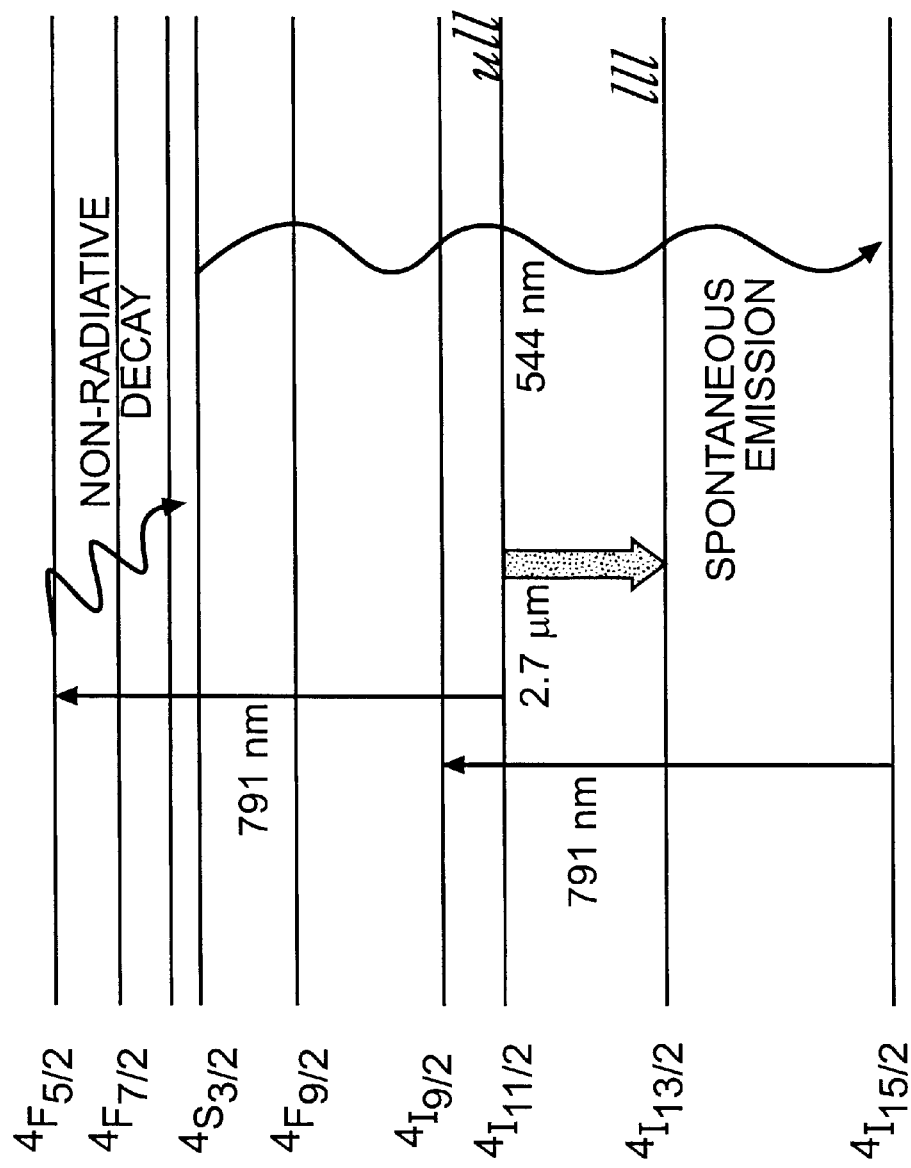
FIG. 4 is an energy diagram illustrating the role of the excited state absorption of 791 nm from the upper laser level, $^4I_{11/2}$, resulting in generation of green 544 nm upconversion fluorescence in an Er-doped fiber.

Strong green (544 nm) fluorescence is observed when the diode radiation is coupled optimally to the fiber, and was used as a visual indicator to optimize coupling. As illustrated in FIG. 4, this fluorescence is caused by excited state absorption (ESA) from $^4I_{11/2}$ level to the $^4F_{5/2}$ level, followed by rapid non-radiative decay to the $^4S_{3/2}$ level and subsequent fluorescence from the $^4S_{3/2}$ level to the $^4I_{15/2}$ level. Despite its visual advantages, including facilitation of the optimization coupling, this upconversion mechanism represents a detrimental pathway for depopulation of the upper laser level. As such, the choice of the 791 nm pump wavelength was made in part to reduce the detrimental effects of this ESA. The ESA cross-section at 791 nm is approximately 100 time weaker than that at the peak value of 808 nm. Even lower values of ESA from the $^4I_{13/2}$ level can be obtained by detuning the pump laser to shorter wavelengths, but at the expense of reduced ground state absorption and a reduction in the "beneficial" lower laser level, $^4I_{13/2}$, depleting ESA. Wavelength detuning of the order of 2–3 nm may be optimum for this case, and is well within the tuning range of the pump diode array. For a given power level, precise optimization is best done by detuning the pump wavelength for highest output powers.

Figure 5:
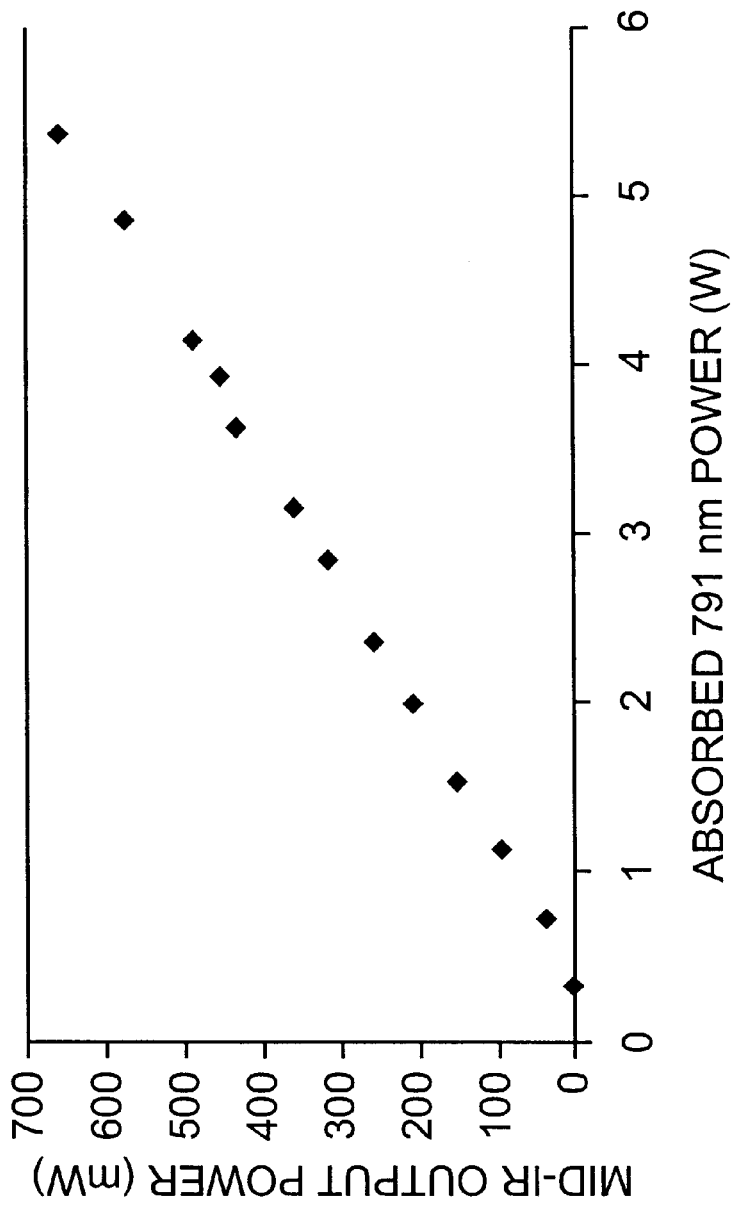
FIG. 5 is a graph illustrating CW 2.7 $\mu$m output power for an Er/Pr:ZBLAN laser of the present invention.

Because of the availability of sufficiently high pump powers and gains, it was possible to achieve lasing off the 4% Fresnel reflections from the two ends of the fiber. All the data reported in this example corresponds to this condition. FIG. 5 shows the 2.7 $\mu$m output power as a function of the absorbed 791 nm diode power. As seen from FIG. 5, the laser threshold is 330 mW and the slope efficiency is 13% with respect to the absorbed power. The linearity of the lot and the lack of any evidence of saturation at the high pump powers clearly indicates scalability over 1 Watt power levels simply by using higher pump powers or more efficient pump coupling and pump absorption techniques.

Given the round-trip losses in the cavity, the round-trip gain was estimated to be as high as 29.4 dB at the threshold pump power density of 1.65 kW/cm$^2$. The significantly lower threshold pump densities used, compared to the $\geq$100 kW/cm$^2$ reported by earlier workers, were attributed to the choice of a double-clad fiber. The relatively high slope efficiency achieved in this example compared to other non-cascade lasing schemes was attributed to relatively efficient depopulation of the lower laser level. Further improvements in the threshold pump densities an slop efficiencies can be made by further optimization of the dopant concentrations, optimization of the coupling efficiency, and reduction of intra-cavity losses due to background absorption in the fiber and at the lasing wavelength and scattering losses at the fiber ends.

EXAMPLE 2

Figure 8:
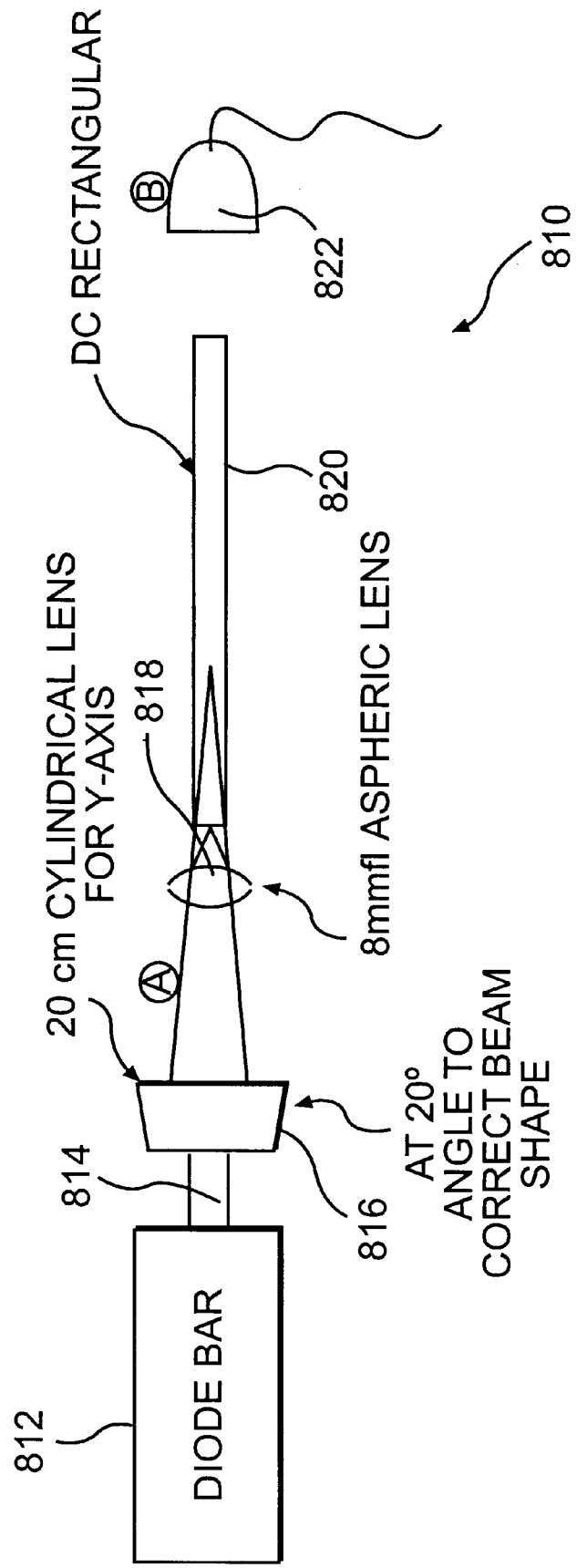
FIG. 8 illustrates a fiber coupling of the present invention.

Tests were conducted using the fiber coupling set up 810 shown in FIG. 8. FIG. 8 illustrates a diode laser 812 emitting a light beam 814 that passes through a 20 cm cylindrical lens 816 rotated at a 20° angle on its y-axis to correct beam shape. After being corrected by cylindrical lens 816, the light beam 814 is focused by an 8 mm aspheric lens 818 into a Er/Pr:ZBLAN fiber 820 having a rectangular inner cladding shape. Light 822 emerging from the fiber is detected by a detector 824.

Table 1 shows the results for Power In, the power of the light beam entering aspheric lens 818, for Power Out, the power detected at detector 824, and the ration of Power Out/Power In for various power settings of the laser set-up.

TABLE 1

| Power In | Power Out | Power Out/Power In |
| --- | --- | --- |
| 570 W | 300 mW | 53% |
| 1.35 W | 710 mW | 53% |
| 1.87 W | 1.0 W | 53.5% |
| 2.75 W | 1.5 W | 54.5% |
| 3.6 W | 2.0 W | 55.5% |
| 5.2 W | 3.0 W | 57.7% |
|  | 3.5 W | Burnt end |

It should be appreciated that while the above discussion has focused mainly on the use of Er as dopant, other dopants may be utilized that allow cross-relaxation to other energy levels, as discussed above in the definitions section, in conjunction with the teachings of this invention. In addition, while the above discussion has focused on waveguide lasers, it should be appreciated that amplifiers may be constructed by the elimination of one or more mirror or reflective coatings in the optical cavity.

Finally, the teachings of the present invention may also be used in conjunction with wavelength-tunable and pulsed (Q-switched and mode-locked) high peak power sources based on such lasers; the latter should also enable the generation of longer mid-IR wavelengths relatively easily via efficient nonlinear optical (Ramman/DFG) techniques.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed:

1. A device for coupling an optical source to a waveguide, said device comprising:
    an optical source, said optical source having an optical plane associated therewith;
    a waveguide; and
    a coupling means comprising an optical element, said optical element having a light receiving surface, said light receiving surface being rotated by an angle of rotation around an axis defined by a line extending from a point of optical emission on said optical source through said optical element to a point at which light is coupled with said waveguide.

2. The device recited in claim 1, wherein said optical elements is selected from the group consisting of cylindrical lenses and barrel lenses.

3. The device recited in claim 1, wherein said optical source is a 1 dimensional array of light emitting elements.

4. The device recited in claim 1, wherein said optical source is a multi-dimensional array of light emitting elements.

5. The device recited in claim 1, wherein said angle of rotation is between 0.1° and 89.9°.

6. The device recited in claim 1 wherein said coupling means comprises a single optical element for providing astigmatism correction and beam shaping.

7. A device for coupling an optical source to a waveguide, said device comprising:
    an optical source, said optical source having an optical plane associated therewith;
    a waveguide; and
    an astigmatism correction and beam shaping means, said means comprising a single optical element, said optical element having a light receiving surface, said light receiving surface being rotated by an angle of rotation around an axis defined by a line extending from a point of optical emission on said optical source through said optical element to a point at which light is coupled with said waveguide.

8. The device recited in claim 7 wherein said optical element is selected from the group consisting of cylindrical lenses and barrel lenses.

9. The device recited in claim 7, wherein said optical source is a 1 dimensional array of light emitting elements.

10. The device recited in claim 7, wherein said optical source is a multi-dimensional array of light emitting elements.

11. The device recited in claim 7, wherein said angle of rotation is between 0.1° and 89.9°.

12. A high power diode-pumped fiber laser, said fiber laser comprising:
    an array of diode lasers, said array of diode lasers having an optical plane associated therewith;
    a waveguide; and
    an astigmatism correction and beam shaping means, said means comprising a single optical element, said optical element having a light receiving surface, said light receiving surface being rotated by an angle of rotation around an axis defined by a line extending from a point of optical emission on said optical source through said optical element to a point at which light is coupled with said waveguide.

13. The device recited in claim 12, wherein said array of diode lasers is a 1 dimensional array of diode lasers.

14. The device recited in claim 12, wherein said array of diode lasers is a multi-dimensional array of diode lasers.

15. The device recited in claim 12, wherein said angle of rotation is between 0.1° and 89.9°.

* * * * *